United States Patent [19]
Schultz et al.

[11] Patent Number: 5,859,791
[45] Date of Patent: Jan. 12, 1999

[54] CONTENT ADDRESSABLE MEMORY

[75] Inventors: Kenneth James Schultz, Kanata; Garnet Frederick Randall Gibson, Nepean; Farhad Shafai, Nepean; Armin George Bluschke, Nepean, all of Canada

[73] Assignee: Northern Telecom Limited, Montreal, Canada

[21] Appl. No.: 923,823

[22] Filed: Sep. 4, 1997

Related U.S. Application Data

[60] Provisional application No. 60/037,834, Feb. 6, 1997.
[51] Int. Cl.[6] .................................................. G11C 13/00
[52] U.S. Cl. ...................... 365/49; 365/189.05; 365/203; 365/189.07
[58] Field of Search ................... 365/49, 189.05, 365/189.01, 203, 189.07

[56] References Cited

U.S. PATENT DOCUMENTS

| | | | |
|---|---|---|---|
| 5,289,403 | 2/1994 | Yetter | 365/49 |
| 5,345,411 | 9/1994 | Yoneda | 365/49 |
| 5,422,838 | 6/1995 | Lin | 365/49 |
| 5,453,948 | 9/1995 | Yoneda | 365/49 |
| 5,455,784 | 10/1995 | Yamada | 365/49 |
| 5,469,378 | 11/1995 | Albon et al. | 365/49 |
| 5,495,382 | 2/1996 | Albon | 365/49 |
| 5,617,348 | 4/1997 | Maguire | 365/49 |
| 5,642,322 | 6/1997 | Yoneda | 365/230.03 |

*Primary Examiner*—Viet Q. Nguyen
*Attorney, Agent, or Firm*—Angela C. de Wilton

[57] ABSTRACT

The implementation of two-dimensional decoding, necessary to achieve a reasonable array aspect ratio for a large content addressable memory, is achieved by having multiple match lines per physical row, these match lines being physically routed on top of the array core cell in an upper metal layer. To limit power dissipation in the resulting large-capacity content addressable memory, the match function is implemented by two or more NAND chains per word. Means for achieving the precharging and evaluation of these chains, and for implementing dummy chains for the provision of timing information, are also disclosed.

36 Claims, 11 Drawing Sheets

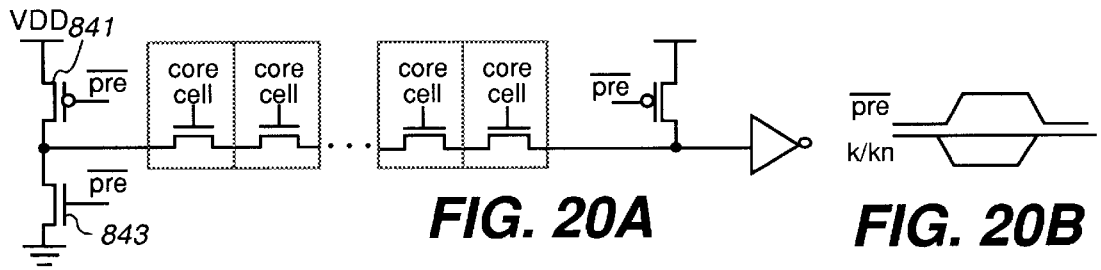
FIG. 20A  FIG. 20B
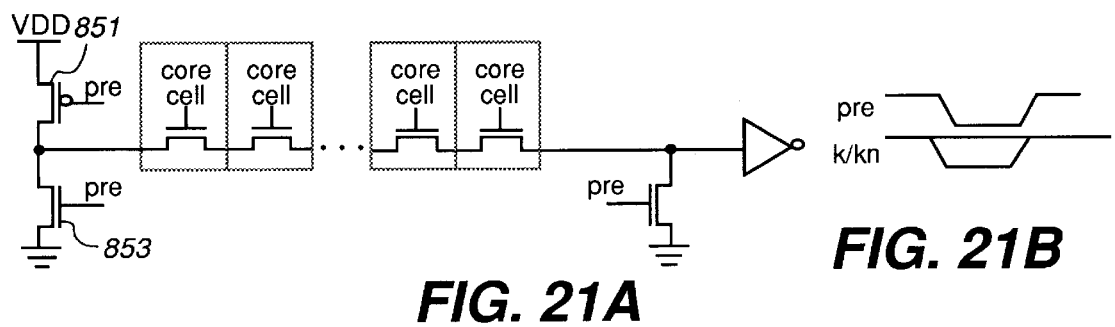
FIG. 21A  FIG. 21B
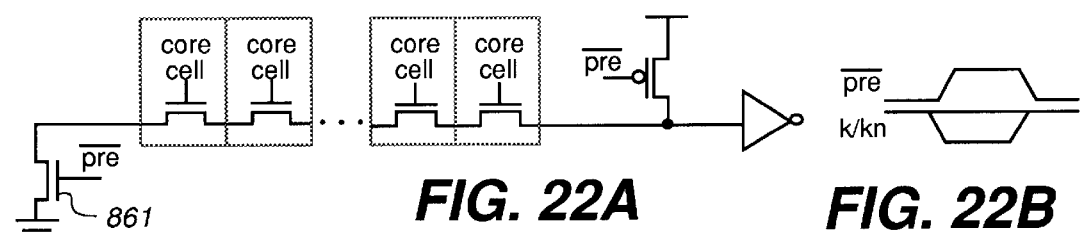
FIG. 22A  FIG. 22B
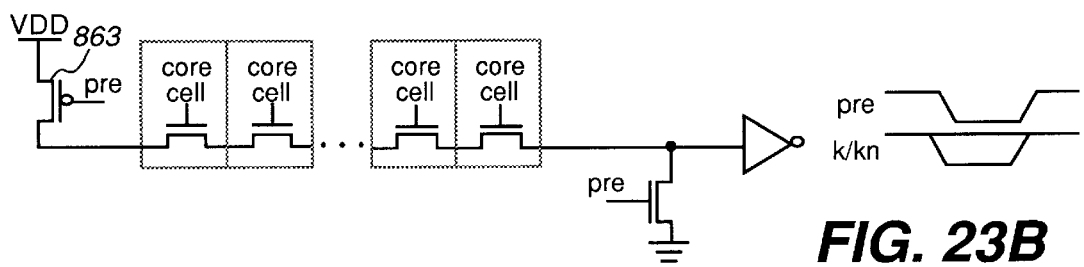
FIG. 23A  FIG. 23B

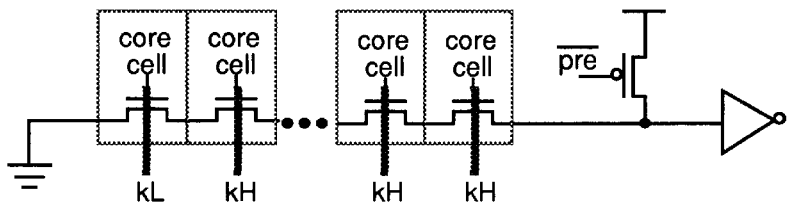 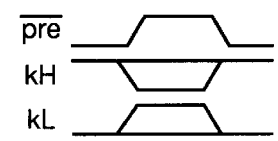
FIG. 24A  FIG. 24B
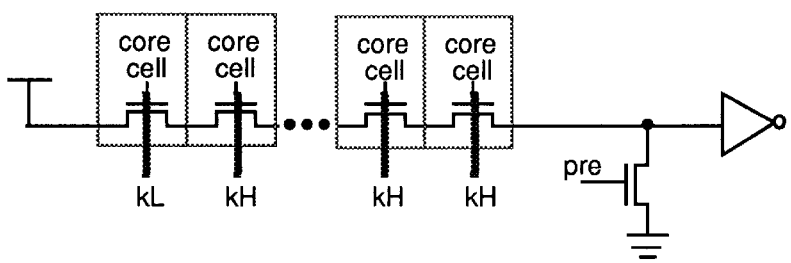 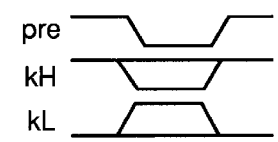
FIG. 25A  FIG. 25B
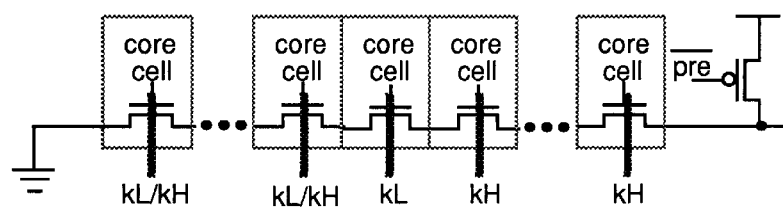 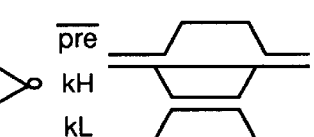
FIG. 26A  FIG. 26B
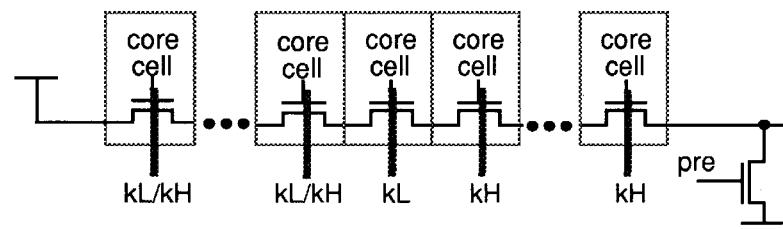 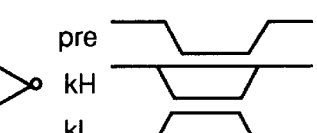
FIG. 27A  FIG. 27B

5,859,791

CONTENT ADDRESSABLE MEMORY

This is a provisional application Ser. No. 60/037,834, filed Feb. 6, 1997.

TECHNICAL FIELD

The present invention relates to content addressable memory (CAM).

BACKGROUND INFORMATION

CAMs are memories in which data is selected based on its contents, rather than its physical location. This function is useful for many applications, especially when performing a look-up for the purposes of mapping from a long identification word to a shorter word. This operation is required in many telecom functions, including Asynchronous Transfer Mode (ATM) address translation.

U.S. Pat. No. 5,289,403 entitled "Self-Timed Content Addressable Memory Access Mechanism with Built-In Margin Test Feature" granted to J. D. Yetter on Feb. 22, 1994 describes a means of providing self-timing to a NOR-match line CAM, using a dummy column and dummy row. The bit at the intersection of the dummy column and dummy row always misses, while all other cells in that row always match, and this generates the slowest possible mismatch condition on the dummy match line. This signal is then used to generate a clock for timing of subsequent events, and for qualifying all other match lines.

U.S. Pat. No. 5,453,948 entitled "Associative Memory" granted to M. Yoneda on Sep. 26, 1995 describes a low-power implementation of a match line, in which the match line is realized as a series chain, instead of a NOR.

U.S. Pat. No. 5,455,784 entitled "Associative Memory Device with Small Memory Cells Selectively Storing Data Bits and Don't Care Bits" granted to H. Yamada on Oct. 3, 1995 describes a CAM with individual storage cells comprised of a series combination of two EEPROM devices. The series connection of these cells (one per bit) to form a word of CAM results in a series match line chain. Shifted transistor threshold voltages, resulting from programming, cause the EEPROM devices to act as either enhancement- or depletion-mode transistors, and hence "don't cares" may be stored by making both devices depletion-mode.

U.S. Pat. No. 5,469,378 entitled "Content Addressable Memory Having Match Line Transistors Connected in Series and Coupled to Current Sensing Circuit" granted to R. Albon et al on Nov. 21, 1995 describes a series match line chain.

Most previous CAMs employ a dynamic wired-NOR match line pull-down, which provides high speed. However, the prior art circuit construction causes match lines associated with mismatched words to experience transitions, while no transitions occur on match lines associated with matched words. Since the number of matches is much smaller than the number of mismatches, the number of transitions, and hence the power dissipation, is excessive for a wired-NOR match line CAM.

SUMMARY OF THE INVENTION

The present invention intends to implement CAMs of sufficient capacities for ATM address translation table applications, for example. The inadequacy of techniques known as prior art is due to both architectural and circuit limitations. Two of the design problems that are addressed by the present invention are (i) the implementation of two-dimensional decoding, necessary to achieve a reasonable array aspect ratio for a large memory; and (ii) achieving low power dissipation, despite the simultaneous searching of the entire contents of the large CAM.

To achieve implementation of two-dimensional decoding, there must be multiple words in a single physical row. This can be achieved by either (a) sharing match lines between multiple words, or (b) having multiple match lines per physical row. In this invention, the second approach is chosen.

According to the most general aspect of the present invention, there is provided a content addressable memory (CAM) comprising: w words of matching means, each word comprising i segmented match line chains, each match line chain comprising b/i core cells which are chained by a match line, each core cell comprising means for storing data, w, i and b being integers; logic means for logically coupling the match line chains in a respective row; and encoding means for providing search results based on the outputs from the logic means.

For example, the logic means comprises NAND circuit means. In a case of the NAND circuit being dynamic NAND circuit, power dissipation decreases. The CAM may further comprise means for sensing the transitions of data signals on the chains. In the CAM, the cell arrays are segment pairs which are oriented in mirror images, such that their outputs face each other, facilitating the logic combination of the two partial match results from the two cell arrays, by the logic means.

The CAM may employ a dummy word, but it does not employ a dummy column. As well, the dummy words model a match, rather than a mismatch. The words in the CAM are divided into a plurality of segments, with a match line chain per segment. The CAM uses purely voltage sensing means.

BRIEF DESCRIPTION OF THE DRAWINGS

The present invention will be further understood from the following description with reference to the accompanying drawings, in which:

FIG. 20A illustrates a pull-down chain circuit with quiescent precharge from both ends of the chain;

FIG. 20B illustrates signal timing of the precharge;

FIG. 21A illustrates a pull-up chain circuit with quiescent precharge from both ends of the chain;

FIG. 21B illustrates signal timing of the precharge;

FIG. 22A illustrates a pull-down chain circuit with quiescent precharge and a single clock-controlled quiescent-off device;

FIG. 22B illustrates signal timing of the precharge;

FIG. 23A illustrates a pull-up chain circuit with quiescent precharge and a single clock-controlled quiescent-off device;

FIG. 23B illustrates signal timing of the precharge;

FIG. 24A illustrates a pull-down chain circuit with quiescent precharge and a single data-controlled quiescent-off device;

FIG. 24B illustrates signal timing of the precharge;

FIG. 25A illustrates a pull-up chain circuit with quiescent precharge and a single data-controlled quiescent-off device;

FIG. 25B illustrates signal timing of the precharge;

FIG. 26A illustrates a pull-down chain circuit with quiescent recharge and intentional charge sharing;

FIG. 26B illustrates signal timing of the precharge;

FIG. 27A illustrates a pull-up chain circuit with quiescent precharge and intentional charge sharing;

FIG. 27B illustrates signal timing of the precharge; and

DETAILED DESCRIPTION

Figure 1:
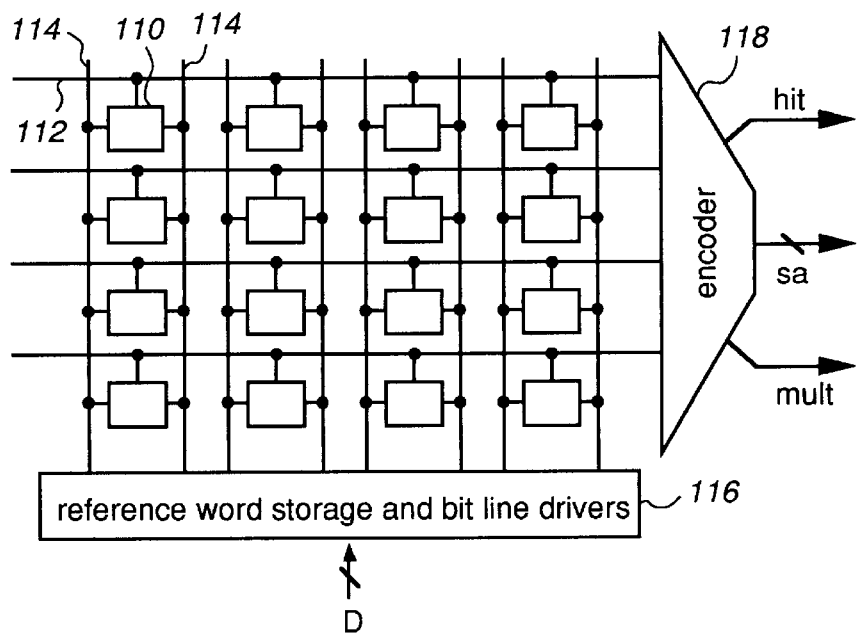
FIG. 1 illustrates a prior art CAM.

The majority of prior art CAMs employ wired-NOR match lines, as shown in FIG. 1. Referring to FIG. 1, a single chip CAM of w (=4) words×b (=4) bits is implemented as a CAM with w rows and b columns. The memory array includes w×b (=16) memory core cells 110, each being at the intersection of a match line 112 and a pair of bit lines 114. A pair of bit lines 114 carry differential data representing a single bit, rather than two bits of data. Each core cell 110 acts to store a single bit of data and is capable of performing a single-bit comparison (logical exclusive NOR (XNOR)) operation, in addition to its bit storage capability. In FIG. 1, the cells 110 belonging to a given word are connected to the match line 112 of that word in a logical NOR fashion.

The bit lines 114 for differential data are connected to reference word storage and bit line drivers 116 which receive input data D for loading the contents of the CAM and for the search reference word. Data stored in the array's core cells 110 are searched by applying a reference word on the bit lines 114.

When differential data is asserted on a pair of bit lines 114 in a search operation, the core cell 110 compares its stored data bit with the differential data (also known as reference data, or a single bit of the comparand). When the stored data is not equal to the reference data, the core cell 110 pulls the match line 112 (which is precharged to a logical high state) down to a low state. When the stored data is equal to the reference data, the cell 110 has no effect on the match line 112 to which it is connected. Because all b core cells 110 in a given word are connected to the match line 112 in the same way, the match line 112 will be pulled low if any bit in its word is unequal to (or mismatches) the corresponding reference bit. The match line 112 remains in a logical high state only if all bits in its word are equal to the reference data.

The CAM includes an encoder 118 which produces three outputs representing the result of the search operation. A hit signal hit will be asserted to a logical high state, if any of the w words is storing data which has matched the reference data. The binary address of this matching word is encoded and an address signal sa is provided. In the event that a plurality of words have matched the reference data, a multi-match signal mult is asserted to a logical high state. In this event, the address sa output of the encoder 118 may produce (a) an invalid result, (b) an address representing the location of a single one of the multiple matches, or (c) a sequence of outputs, representing the locations of each of the matched words. Note that some applications may not require the "mult" result.

An alternative CAM of a large-capacity having time-shared comparators and multiple match lines running over each core cell is disclosed in U.S. patent application Ser. No. 08/748,928 entitled "Large-Capacity Content Addressable Memory", filed on Nov. 14, 1996 by K. J. Schultz et al, which is incorporated herein by reference. The CAM employs a dynamic wired-NOR match line pull-down and includes single-bit comparators which are not located in the core cells, but are instead time-shared among multiple words. The circuit construction causes match lines connected to mismatched words to experience transitions, while matched words cause no transitions.

Because it is expected that only one, or at the most a very few match will occur, the number of transitions and the resulting power dissipation are excessive for a NOR match line.

Figure 2:
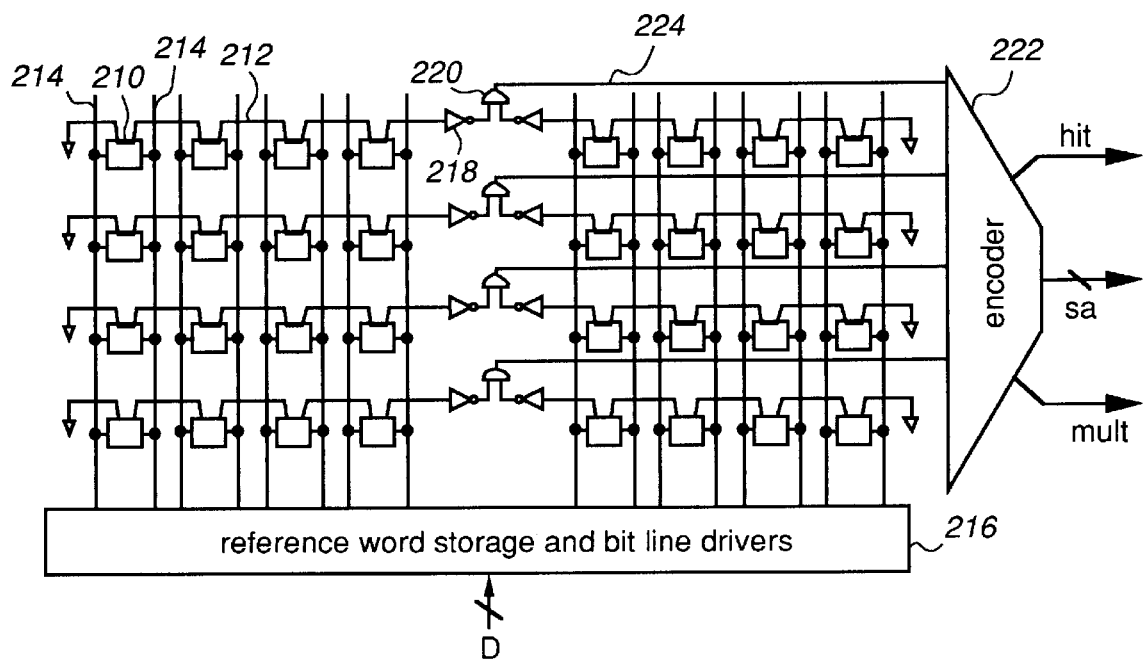
FIG. 2 illustrates a CAM according to an embodiment of the present invention.

FIG. 2 shows a CAM according to an embodiment of the present invention. Referring to FIG. 2, there are w (=4) words shown, each occupying a row, and each having b (=8) bits and b (=8) core cells 210. The words are divided into two halves, and the results of the match on each half word are combined. Each of the two halves is provided with an array of 4 rows×4 columns. The array includes 16 core cells 210, each being at the intersection of a match line 212 and a pair of bit lines 214 which carry differential data representing a single bit. The bit lines 214 for differential data are connected to reference word storage and bit line drivers 216 which receive input data D for loading the contents of the CAM and for the search reference word. Data stored in the array's core cells 210 are searched by applying a reference word on the bit lines 214.

Each core cell 210 acts to store a single bit of data and is capable of performing a single-bit comparison (logical exclusive NOR (XNOR)) operation, in addition to its bit storage capability. In FIG. 2, the cells 210 belonging to a given word are connected to the match line 212 of that word in a logical NAND fashion. The core cells 210 of each word are chained in the respective match line 212. One end of each chain is connected to an inverter 218. The other end of the chain is connected to a terminal of logic 0. The outputs of the inverters 218 are connected to an AND gate 220, the output of which is referred to as a "word match line" 224, and which is connected to an encoder 222.

In FIG. 2, the connection (in each half word) is in a logical NAND. The match line 212 will only have a downward transition, if all of the bits in the half word are equal to the reference data. Hence, the path to ground for the match line 212 is serial (a "match line chain") rather than parallel, and the path is made conductive (i.e., the circuit is closed) in the event of a match, rather than a mismatch.

The advantage of this technique is due to the much smaller number of match lines 212 subject to a transition in each search operation: one per match in the embodiment shown in FIG. 2, compared to one per mismatch in the prior art circuit shown in FIG. 1. This reduces power dissipation considerably, allowing the realization of larger storage capacities. The division of the word into halves decreases the length of the NAND chain, thus increasing speed.

The embodiment of a CAM shown in FIG. 2 also includes means of placing multiple words in a physical row, by employing an upper metal layer above the core cell for multiple word match lines 224. This further increases the storage capacity that can be realized.

The CAM produces three output signals hit, sa and mult that represent the result of the search operation, and these may all be generated by the encoder 222. The hit signal hit is asserted to a logical high state if any of the w words is storing data which has matched the reference data. The binary address of this matching word is encoded and the address signal sa is provided. In the event that a plurality of words have matched the reference data, a multi-match signal mult is asserted to a logical high state. In this event, the address sa output of the encoder 222 may produce (a) an invalid result, (b) an address representing the location of a single one of the multiple matches, or (c) a sequence of outputs, representing the locations of each of the matched words.

Figure 3:
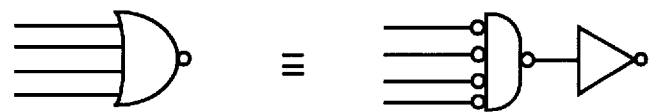
FIG. 3 illustrates a logical equivalence of a NOR and NOT-AND gates.
Figure 4:
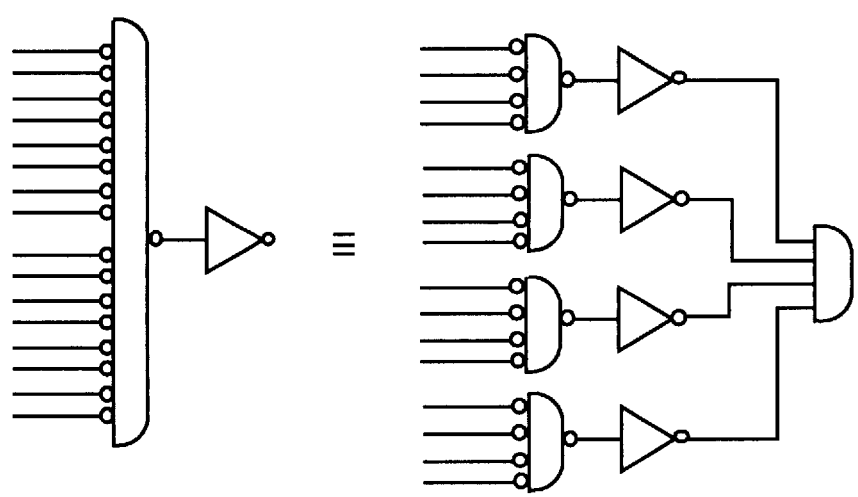
FIG. 4 illustrates a logical segmentation of the NOT-AND gates.

The CAM shown in FIG. 2 employs a lower-power circuit of equivalent function to the NOR match line. A logical equivalent of a NOR is a NOT-AND, as shown in FIG. 3. Thus, instead of checking whether any bit mismatches, and producing a logical ml=match, it may be checked whether all bits match (which, if true, will result in a pull-down), yielding the logical mln=match. This choice of Boolean implementation results in far fewer transitions (because transitions only occur in the case of matches), and therefore, lower power dissipation. Unfortunately, it is obvious that a dynamic NAND will be slower than a dynamic NOR. This is especially true for the wide words (b>16). On the one hand, delay caused by such a long pull-down chain becomes tolerable in advanced CMOS technologies, especially in relation to a "slow" (<100 MHz) application. On the other hand, it would be beneficial to take some steps to reduce the delay. This is easily done by dividing the word into a number $i \geq 2$ segments, with one series chain per segment, combining the results as shown in FIG. 4. This satisfies the concurrent design goals of high speed and wide words.

It is clear that, when each first-stage NAND is implemented as a dynamic gate, it results in more transitions and higher power due to matches of partial words. Hence, there results a continuous power-speed trade-off: the more segments into which the word is divided, the higher the speed and power, with the logical extreme in both speed and power being the NOR. At the other extreme of low speed and low power is the single NAND chain, which is equally undesirable. Because the simplest segmentation to implement is a division into i=2 chains, this will serve as the example embodiments shown FIGS. 5A, 6A and 7A.

Figure 5A:
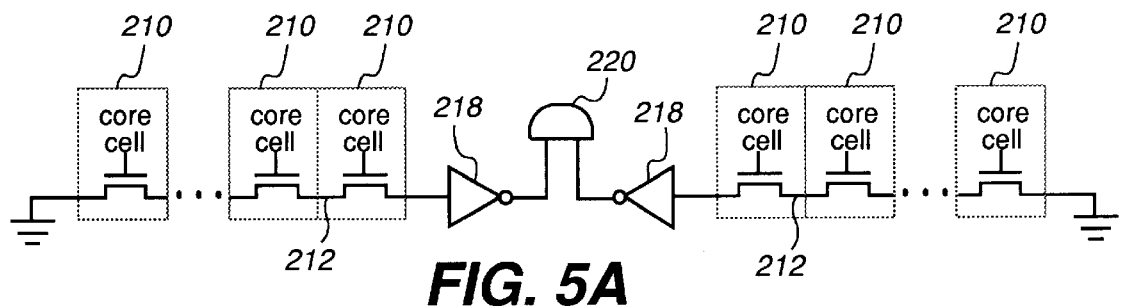
FIG. 5A illustrates a match line circuit composed of two segments.
Figure 5B:
FIG. 5B captures conceptually the two segment circuit shown in FIG. 5A.
Figure 6A:
FIG. 6A illustrates a single word of storage with its match line.

FIG. 5A shows a match line circuit composed of two segments (two chains) which are used in the CAM shown in FIG. 2. FIG. 5B shows conceptually first and second segments (chains) 522 and 524. Referring to FIG. 5A, N-channel FETs of the match line chains are shown explicitly with core cells. Each of the match line chains is connected to the inverter 218 and each output of the two inverters 218 is connected to the AND gate 220. With the word divided in two, the second chain 524 is oriented as the mirror image of the first chain 522, and they are brought together, such that their outputs face each other. In FIG. 5A, the chain is physically implemented as a pull-down chain, with a GND (or VSS) connection used at one end opposite the output of the chain. Alternatively, the chain may physically be implemented as a pull-up chain, with a power (or VDD) connection used at one end opposite the output of the chain and with the inverters logically removed.

Figure 6B:
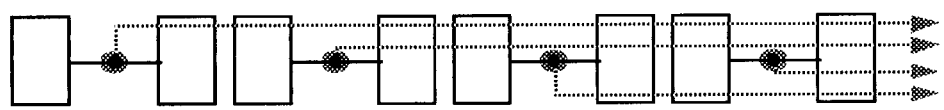
FIG. 6B illustrates four words sharing an encoder.

The word match line must be routed to an encoder, where the actual physical address information is derived from the match information, as described above, and shown in FIG. 2. This routing is most easily done above the core cells, in the highest level of metal available. This is done in FIG. 6A for a single word, assuming the encoder (not shown) is to the right. One may, by extension, run multiple match lines over each core cell, and place multiple columns of words adjacent to the same encoder, as shown in FIG. 6B. A capacity that is a multiple of four words may be achieved by stacking a plurality of these units in the vertical dimension.

Figure 7A:
FIG. 7A illustrates a single physical row with two encoders.
Figure 7B:
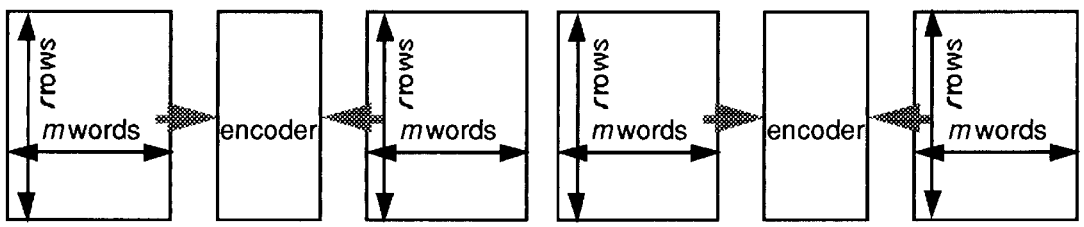
FIG. 7B illustrates an array with a plurality of the rows illustrated in FIG. 7A.

If the number of word match lines over each core cell (actually, the number of word match lines over the core cells closest to the encoder) is m, there will be m words adjacent to each other, with no intervening encoder. As shown in FIGS. 7A and 7B, one is not limited to a single encoder. There are 2*m words associated with each encoder, per row.

If the number of encoders is e, there will be 2*m*e words per row. If the number of rows is r, the array will have a capacity of 2*m*e*r words. The outputs of the e encoders may be combined at the physical bottom or top of the array shown in FIG. 7B.

Figure 8A:
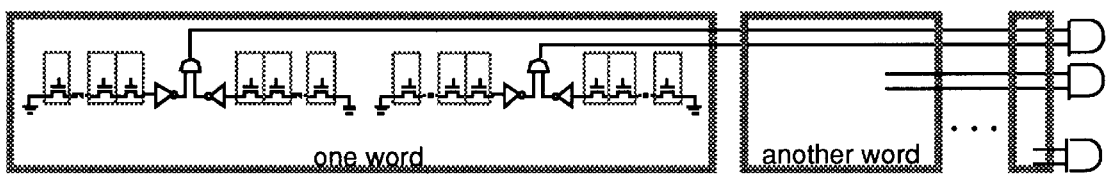
FIG. 8A illustrates multiple words of four segments each.
Figure 8B:
FIG. 8B illustrates multiple words of eight segments each.

If, instead of dividing a word into exactly i=2 segments, it is divided into i>2 segments, the output of the circuit such as that shown in FIGS. 5A and B represents a partial word result, rather than a true word match line. These partial word results may be combined immediately adjacent to the encoder, as shown in FIGS. 8A and 8B.

The parameters are summarized as follows:

The number of word match lines running above each core cell is m

The number of word match lines plus partial word result lines running above each core cell is i *m/2 (we assume here that i is even, but point out that it could be odd).

The number of word match lines per physical row, also equal to the number of words per physical row, is 2*m*e.

The number of inputs to each encoder per row is 2*m.

Figure 9:
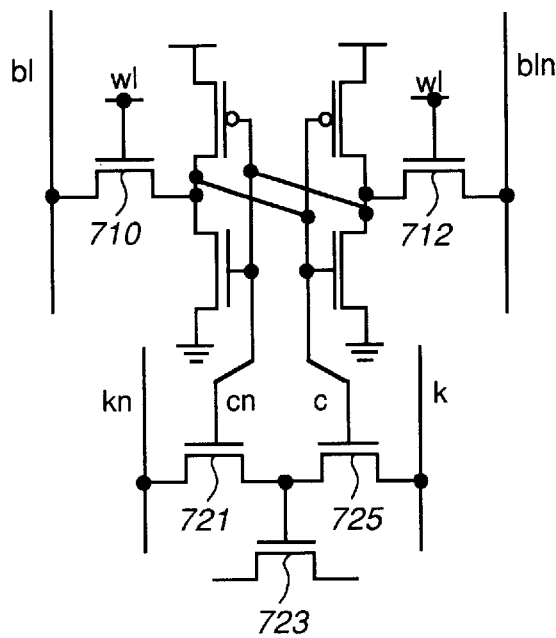
FIG. 9 is a transistor-level schematic diagram of a memory core cell.

FIG. 9 shows an example of the memory core cell 210 of the CAM shown in FIG. 2. The core cell shown in FIG. 9 is a transistor-level core cell. The cell is comprised of two cross-coupled inverters between the two static storage nodes, and two access FETs 710 and 712 gated by a word line wl, joining the storage nodes c and cn to a pair of bit lines bl and bln. This is a known arrangement for a static SRAM core cell (inverters of P- and N-channel FETs). Other three N-channel FETs 721, 723 and 725 form the comparison portion of the cell. The gate, drain and source of the FET 721 are connected to the negative storage node cn, a negative compare bit line kn and the gate of the FET 723, respectively. The gate, drain and source of the FET 725 are connected to the positive storage node c, a positive comparison bit line k and the gate of the FET 723, respectively. The FET 723 itself forms a part of the match line chain and constitutes the device shown explicitly in FIGS. 5A and 8A, with its source and drain connected, as appropriate to its location in the chain, to either similar FET in neighbouring cells, or to the circuitry comprising either end of the chain.

The compare bit lines k/kn are separate physical wires from the normal bit line pair bl/bln, running parallel to them in the vertical direction. Employing separate lines decreases the capacitive load on each, hence decreasing power dissipation and increasing speed. It also allows the independent setting of the quiescent states at the storage access devices, and the comparison devices; bl/bln may be kept high during a search, in preparation for the next read or write, and k/kn may be kept high or low during a read or write, in preparation for the next search.

The function achieved by the cell is the combination of (a) the storage of a bit of data, and (b) the switching of a device in the match line chain: on in the case of the compare bit matching the stored bit, and off in the case of the compare bit mismatching the stored bit. In other words, if the binary value stored in the cell at node c, matches the comparand on line k, the FET 723 is conducting. To mask a given bit from the search, one must ensure that it always matches, and that the chain FET 723 is always conducting; this is done by asserting both k and kn high.

Figure 10:
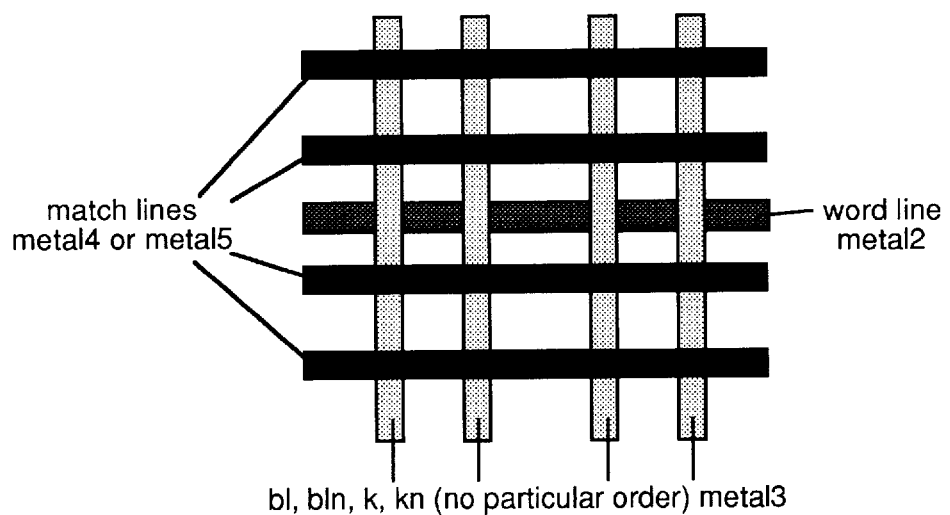
FIG. 10 is a view of memory core cell upper metal layers.

Assuming i=2 and m=4, and ignoring the power rails VDD/VSS, the global signal upper-layer metal view of the core cell is shown in FIG. 10. All layers from second metal and up are shown. Referring to FIG. 10, the layer of the third metals is overlying the layer of the second metal and underneath the layer of the fourth and fifth metals. The second metal is the word line metal (wl). The third metals are the bit line metals (bl and bln) and comparison bit line metals (k and kn). The fourth and fifth metals are the match line metals. The number of horizontal signals in the top layer of metal would be the same for i=4 and m=2, or i=8 and m=1.

Figure 11:
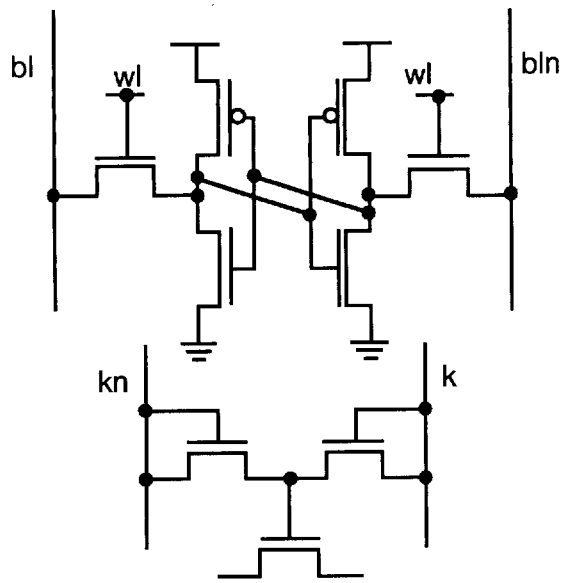
FIG. 11 illustrates a first example of a modified core cell.
Figure 12:
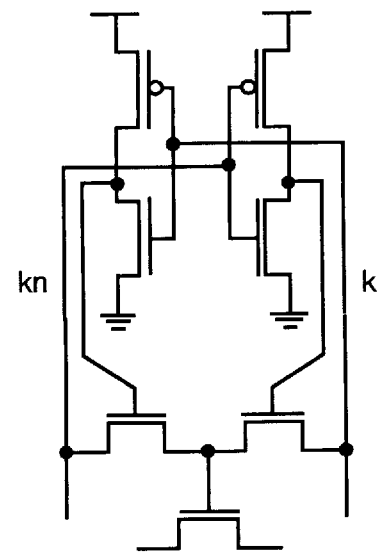
FIG. 12 illustrates a second example of a modified core cell.
Figure 13:
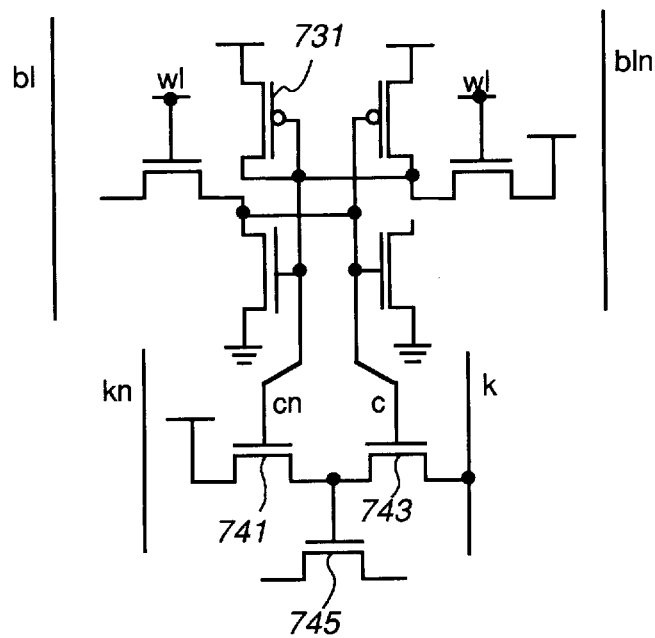
FIG. 13 illustrates a third example of a modified core cell.

The core cell may be modified, at the transistor level, in three different ways, to yield a cell that always matches; that is, it occupies the same area as a real core cell, and uses transistors of the same size, but the result of the search is guaranteed to be the conduction of the chain device. These three modified core cells are useful in the implementation of a dummy (or model) word or chain, and are shown in FIGS. 11, 12, and 13. The cell shown in FIG. 11 has its chain device continually on—there is never a discharge path for the gate of the chain device. The cell shown in FIG. 12 (which is referred to as "conditionally on") matches when either or both of k/kn are high; when both are low, the chain device is off. Two additional devices (not shown) may be included in the cell shown in FIG. 12 for the purpose of providing model load on the word line. In FIG. 13, node cn is continually pulled up by the diode-connected P-channel FET 731, and is also pulled up to VDD whenever the word line wl is asserted (the VDD connection is not strictly necessary, and may be replaced with a floating drain, depending on which option presents the more convenient layout topology). As a result, node c is held low. The combination of cn high at the gate of a FET 741, and VDD applied at the source of the FET 741, which is connected to a FET 743, results a FET 745 conducting continually, as desired.

Figure 14:
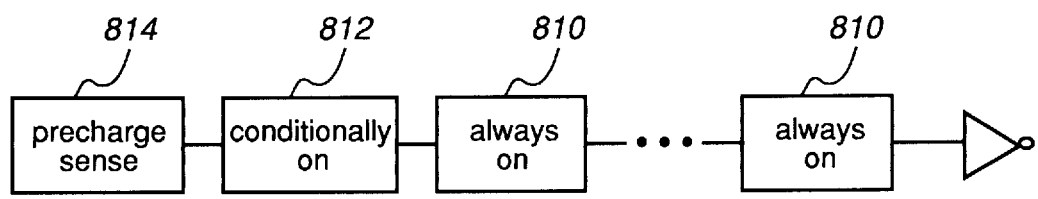
FIG. 14 illustrates a dummy chain used to detect the completion of precharge.
Figure 15:
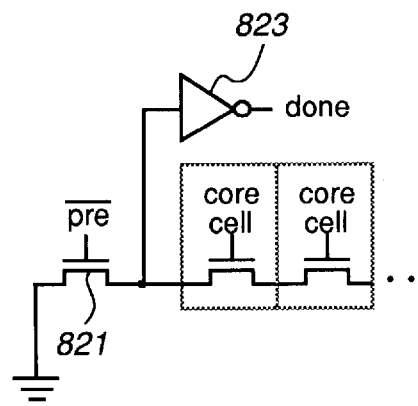
FIG. 15 illustrates a simple implementation of a precharge sense circuit.

A dummy chain may be used for two purposes. The first purpose is to determine when sufficient time has been allotted for precharge of the chain. A chain that may be used for this purpose is shown in FIG. 14. The chain is made up of a number of consecutive "always on" cells 810, such as that shown in FIG. 11, a single "conditionally on" cell 812, such as the one shown in FIG. 12, and a precharge sense circuit 814, such as the one shown in FIG. 15. The precharge sense circuit includes a FET 821 and an inverter. A precharge signal is fed to the gate of the FET 821 and a precharge done signal is provided from the output of the inverter 823. The "conditionally on" cell 812 is included to reflect the condition that precharge cannot be completed until the k/kn signals have been asserted to their valid search voltages. To more properly reflect the propagation delay through the chain as a result of k/kn assertion, the entire dummy chain may be made up of "conditionally on" cells (this implementation is not shown). The precharge sensing dummy chain is not required in all implementations, as is described below.

The second purpose of a dummy chain is as a segment of a dummy word, to determine the time interval for successful evaluation of a match. A word that always matches is used to generate a timing signal which can be used to clock the evaluation of all other match signals. This word may be constructed with the chain as shown in FIG. 14, or with all "conditionally on" cells, or with the cells shown in FIG. 13. Note that the precharge sense circuit is not required. The timing signal that is generated can further be used to clock the encoder, or as part of a self-timing path for the CAM as a whole. The match evaluation timing dummy word can be used with all implementations.

Note that the CAM architecture results in inherently deterministic search delays. All match lines begin in a mismatch state, and all have equivalent delay to transition to a match state. Hence, in modelling a match, one is guaranteed to be modelling the slowest condition. In the prior art case of a NOR match line, all match lines begin in a match state, and the speed of the transition to a mismatch state depends on the number of bits mismatching. The important timing condition of validity of the match state on the match line must be inferred by observing the slowest possible mismatch.

There are many possible ways to implement a match line chain, in terms of polarity selection, and precharge and evaluation timing and control. The following descriptions cover a variety of the possible implementations, but are not meant to limit the scope of the invention. A person reasonably skilled in the art could devise other similar techniques.

Figure 16A:
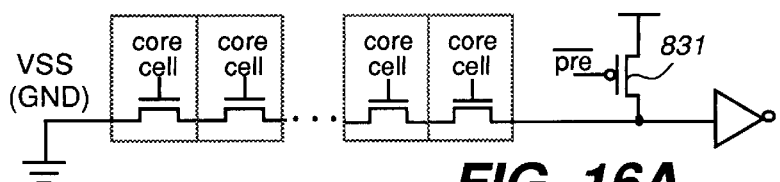
FIG. 16A illustrates a pull-down chain circuit with in-cycle precharge.
Figure 16B:
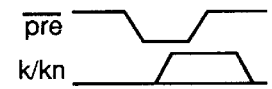
FIG. 16B illustrates signal timing of the precharge.
Figure 17A:
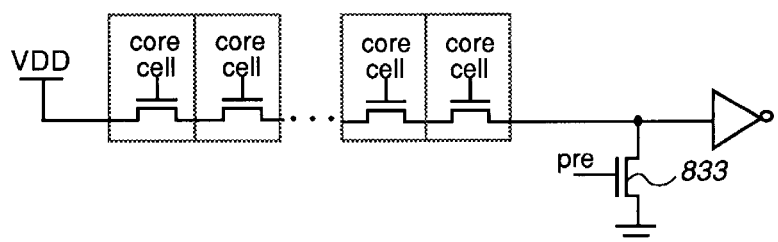
FIG. 17A illustrates a pull-up chain circuit with in-cycle precharge.
Figure 17B:
FIG. 17B illustrates signal timing of the precharge.

FIGS. 16A and 16B show a pull-down chain circuit and signal timing of the precharge, respectively. FIGS. 17A and 17B show a pull-up chain circuit and signal timing of the precharge, respectively. Each of the chain circuits shown in FIGS. 16A and 17A is used in conjunction with a precharge pulse that occurs after the beginning of the cycle. Precharge pulses are fed to the gates of FETs 831 and 833 which are connected to the chains. To avoid charge-sharing problems following the precharge, precharge must overlap the assertion of valid data on k/kn. A dummy chain for precharge sensing is required to determine when precharge has completed, and to initiate timing of the remainder of the search operation. In the case of a match, there is a very resistive power-GND (or VDD-VSS) path through the entire chain toward the end of the precharge operation.

If the precharge begins at the end of the clock cycle (i.e., if the quiescent state of the signals applied to the chain leaves it in the precharged state), there is no need to sense the completion of precharge before initiating the remainder of the search operation. In this case, precharge completion simply represents a minimum requirement for the cycle time of the CAM. This observation applies to all of the remaining chains described in this disclosure.

Figure 18A:
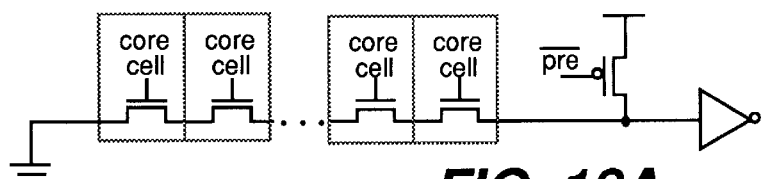
FIG. 18A illustrates a pull-down chain circuit with quiescent precharge.
Figure 18B:
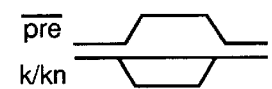
FIG. 18B illustrates signal timing of the precharge.
Figure 19A:
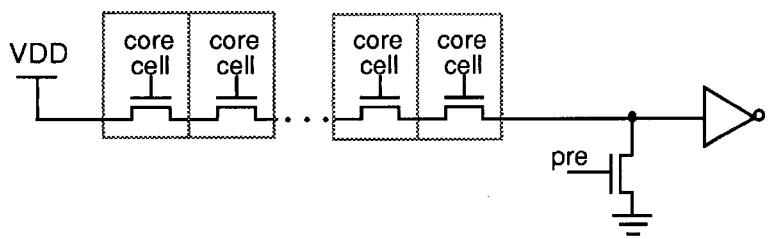
FIG. 19A illustrates a pull-up chain circuit with quiescent precharge.
Figure 19B:
FIG. 19B illustrates signal timing of the precharge.

The chains shown in FIGS. 18A and 19A are identical to those of FIGS. 16A and 17A, except for precharge timing. Note that k/kn are also now in a quiescent high state, allowing complete precharging of all intermediate nodes in the chain. FIG. 18A shows this chain designed to implement a pull-down, and FIG. 19A shows the same concept with a pull-up. FIGS. 18B and 19B show precharge timing in the chains shown in FIGS. 18A and 19A, respectively.

Because precharging from one end of the chain only may be too slow for some applications, precharge devices may be placed at both ends of the chain. This requires the addition of a third device to switch off the evaluation path to the opposite supply during precharge, in order to avoid power-GND current, which would be significant otherwise. Timing is the same as in the case of the chains of FIGS. 18A and 19A. FIG. 20A shows this chain designed to implement a pull-down, and FIG. 21A shows the same concept with a pull-up. The chain shown in FIG. 20A has series-connected P- and N-channel FETs 841 and 843 in a power-GND (or VDD-VSS) path, the junction of the FETs being connected to the end of the chain. Similarly, the chain shown in FIG. 21A has series-connected P- and N-channel FETs 851 and 853 in a power-GND (or VDD-VSS) path, the junction of the FETs being connected to the end of the chain. Due to FET gating signal selection, neither of these VDD-VSS paths are conductive, except during pre/$\overline{pre}$ transition. FIGS. 20B and 21B show precharge timing in the chains shown in FIGS. 20A and 21A, respectively.

Precharging from a single end of the chain may be fast enough, but the circuits of FIGS. 18A and 19A may be undesirable due to the resistive power-GND current path in the quiescent precharge state. The chains shown in FIGS. 22A and 23A solve this problem by including a transistor to prevent evaluation until precharge has completed. FIG. 22A shows this chain designed to implement a pull-down, and FIG. 23A shows the same concept with a pull-up. The chain shown in FIG. 22A has an N-channel FET 861 connected between the end of the chain and the ground. The chain shown in FIG. 23A has a P-channel FET 863 connected between the end of the chain and a power VDD terminal. Precharge pulses are fed to the gates of the FETs 861 and 863. FIGS. 22B and 23B show precharge timing in the chains shown in FIGS. 22A and 23A, respectively.

It may be desirable to, at the same time, limit the number of clocked devices in the chain (to limit clocking power), and still remove the possibility of a resistive power-GND short during precharge. It may be preferable to precharge from one end only, as in FIGS. 18A, 19A, 22A and 23A, but it is preferable to use a data-controlled device to prevent short-circuit current, instead of the clock-controlled device of FIGS. 22A and 23A. Hence, there are provided circuits that drive the k/kn signals (referred to as "k-drivers") such that the k-drivers corresponding to the column furthest from the precharge device have a quiescent low/low state, rather than high/high, as is the case in the other columns, and as was the case in FIGS. 18A, 19A, 20A, 21A, 22A and 23A. The chain design is shown in FIGS. 24A and 25A, with the two different types of k signals conceptually shown as a single line through the chain device, labelled either kL or kH. Note that the core cell employed is still that of FIG. 9, and the k line over the chain device is merely conceptual. FIG. 24A shows this chain designed to implement a pull-down, and FIG. 25A shows the same concept with a pull-up. FIGS. 24B and 25B show precharge timing in the chains shown in FIGS. 24A and 25A, respectively.

With all previous chain designs, it is a design goal to totally eliminate the possibility of charge sharing. If the chain length is not required to be variable, and is instead fixed, some charge sharing could be tolerable, and may be intentionally designed into the chain. Precharge delay and power can be decreased slightly by leaving a small number of chain nodes unprecharged. This technique is shown in FIGS. 26A and 27A. The kL column is moved away from the end of the chain opposite the precharge device toward the middle of the chain. Columns to the left of the kL column may be either kL or kH driven. In the statistically unlikely event of a match of all of the bits in the kH columns, but a mismatch in one or more of the other columns, the charge (or lack of charge) on the unprecharged nodes will cause the voltage at the inverter gate to move to an intermediate value which must not be evaluated as a match. If this situation is understood and accounted for, it should be tolerable. FIG. 26A shows this chain designed to implement a pull-down, and FIG. 27A shows the same concept with a pull-up. FIGS. 26B and 27B show precharge timing in the chains shown in FIGS. 26A and 27A, respectively.

In all example designs shown, represented is the match sense circuit as a simple inverter. In fact, this circuit may be implemented as any static or dynamic voltage sense device.

Because some target applications are likely to have a high degree of commonality between matches and mismatches (i.e., they may differ in only a few bits, and have long strings of consecutive bits in common), situations may arise in which excessive power is dissipated in the precharge of these "near-misses". This is especially true if word segments (entire chains) match in mismatched words. Note that this situation has no counterpart in traditional wired-NOR match line CAMs.

One example of the above situation (not intended to limit applicability) is in ATM address look-up. The address is composed of two fields: Virtual Channel Identifier (VCI) and Virtual Path Identifier (VPI). Many entries may (a) have identical VPIs, and differ in a few bits of the VCI, or (b) have identical VCIs, and differ in a few bits of the VPI. In order to limit power dissipation in this event, it is beneficial to scramble the order of the bits in the chain.

Figure 28:
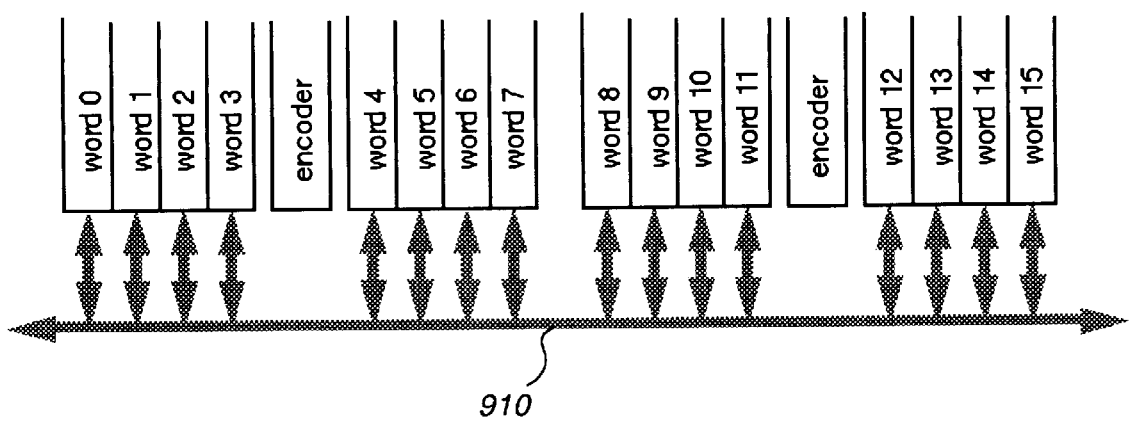
FIG. 28 illustrates an architecture in which columns are organized in a word-sliced fashion.

In most memories, columns are organized in a bit-sliced fashion, such that all columns associated with a given data bit are grouped together. The architecture described in this disclosure is word-sliced, as shown in FIG. 28, instead of bit-sliced. Because of this, a global data bus 910, joining all words (that is, joining all columns associated with each of the bits) is required. Some observations about this bus:

The bus 910 may be used for search, read or write operations, supplying bidirectional data.

All drivers onto the bus 910 must be tri-statable.

Although particular embodiment of the present invention have been described in detail, it should be appreciated that numerous variations, modifications, and adaptations may be made without departing from the scope of the present invention as defined in the claims.

What is claimed is:

1. A content addressable memory (CAM) with w rows×b columns comprising:

w words of matching means, each word comprising i segmented match line chains, each match line chain comprising b/i core cells which are chained by a match line, each core cell comprising means for storing data, w, i and b being integers;

logic means for logically coupling the match line chains in a respective row; and encoding means for providing search results based on the outputs from the logic means.

2. The CAM of claim 1, wherein the logic means comprises NAND circuit means which provides logical outputs in response to the outputs from the match line chains in a respective row.

3. The CAM of claim 1, further comprising means for sensing the transitions of data signals on the chains.

4. The CAM of claim 3, wherein the polarity of data signal swing to signify a match is positive or negative.

5. The CAM of claim 1, wherein each word comprises a pair of segmented match line chains, the pair of match line chains being oriented in mirror images, such that their outputs face each other, facilitating the logic combination of the two partial match results from the two chains, by logic means.

6. The CAM of claim 5, wherein the logic means comprises AND logic means and the word match lines, resulting from the ANDing of partial match results on the match chains, one word match line per word, are routed so as to convey the match result to the encoding means.

7. The CAM of claim 6, wherein the word match lines are selectively routed physically over the core cells in a metal layer above all other signal layers used in the core cell.

8. The CAM of claim 6, wherein the encoding means comprises a plurality of encoders.

9. The CAM of claim 6, wherein multiple words are placed adjacent to the encoding means, with multiple word match lines running over each core cell, allowing multiple word match lines to be routed per row.

10. The CAM of claim 9, wherein the word match lines are selectively routed over the core cells in a metal layer above all other signal layers used in the core cell.

11. The CAM of claim 6, wherein the partial match results are selectively routed above the core cell, to be combined in the AND logic means.

12. The CAM of claim 11, wherein the results from pairs of match line segments are first combined by a logical AND operation into a secondary partial result, the result then being routed above the core cell, to be combined in a final AND gate adjacent to the encoder.

13. The CAM of claim 1, wherein the core cell comprises at least one field effect transistor (FET) for data storing operation, and further comprising logic level/precharging means for supplying a first binary logic level to one end of the chain and for precharging the match line chain to a second binary logic level in response to a clock signal.

14. The CAM of claim 13, wherein the logic level/precharging means comprises means for tying the one end of the chain directly to the a power supply of the first binary logic level.

15. The CAM of claim 13, wherein the logic level/precharging means comprises a first FET at the other end of the chain nearest match sense circuitry.

16. The CAM of claim 15, wherein the logic level/precharging means further comprises means for precharging the chain to the second binary logic level by the first FET, commencing following the beginning of the clock cycle during which a search is to be performed.

17. The CAM of claim 15, wherein the logic level/precharging means further comprises means for precharging the chain to the second binary logic level, commencing following the completion of search operation, continuing during a quiescent state of the CAM, and ceasing prior to the initiation of the next search operation, by the first FET, the FETs for data storing operation in the chain being in a conducting state during precharge.

18. The CAM of claim 13, wherein the logic level/precharging means comprises a first FET at one end of the chain and a second FET at the other end of the chain farthest from match sense circuitry.

19. The CAM of claim 18, wherein the logic level/precharging means comprises means for connecting the one end of the chain to a power supply of the first binary logic level, by a third FET which is made conducting when the first and second FETs are non-conducting, the FETs for data storing operation in the chain being in a conducting state during precharge.

20. The CAM of claim 18, wherein the second FET is conducting when the first FET is non-conducting.

21. The CAM of claim 13, wherein, the logic level/precharging means comprises logic level means and precharging means, the precharging means comprising a first FET at the end of the chain nearest match sense circuitry and precharging the chain to the second binary logic level by the first FET commencing following the completion of the search operation, continuing during a quiescent state of the CAM, and ceasing prior to the initiation of the next search operation, the logic level means directly tying the one end of the chain to a power supply of the first binary logic level, the core cell in the chain at the extreme one end to the match sense circuitry comprising two FETs, compare data being applied to the two FETs at the opposite polarity during the quiescent precharge state, one of the two FETs being non-conducting in the quiescent precharge state.

22. The CAM of claim 13, wherein, the logic level/precharging means comprises logic level means and precharging means, the precharging means comprising a first FET at the end of the chain nearest match sense circuitry and precharging the chain to the second binary logic level by the first FET, commencing following the completion of the search operation, continuing during a quiescent state of the CAM, and ceasing prior to the initiation of the next search operation, the logic level means directly tying the chain to a power supply of the first binary logic level, the core cell at a predetermined and constant location in the chain comprising two FETs, compare data being applied to the two FETs at the opposite polarity during the quiescent precharge state, one of the FETs being non-conducting in the quiescent precharge state, thereby any charge sharing occurring during the search of the chain tending to make a mismatch appear like a match.

23. The CAM of claim 19, wherein the order of the bits in the chains, and among the chains making up each word, is scrambled.

24. The CAM of claim 13, wherein the core cell comprises:

first and second N-channel FETs and first and second P-channel FETs forming two cross-coupled inverters for storing differential data;

third and fourth N-channel FETs coupled with the differential data nodes to differential bit lines, the FETs being gated by a word line, so as to provide access for read and write data operations;

a fifth N-channel FET;

sixth and seventh N-channel FETs, either of them being gated by the positive storage node and for connecting a positive comparison bit line to the gate of the fifth N-channel FET, the other being gated by the negative storage node and for connecting a negative comparison bit line to the gate of the fifth N-channel FET, the comparison bit lines being physically distinct from the bit lines employed for read and write access, the source and drain of the fifth N-channel FET being connected to those of neighbouring cells to form a chain of such FETs.

25. A dummy match line chain for use in a CAM comprising an array of data store cells coupled with bit lines, the dummy match line chain comprising CAM cells.

26. The match line chain of claim 1, further comprising a dummy chain for determining when precharge of all chains is complete, the dummy chains comprising as many dummy cells as the core cells of an actual storage chain, the dummy chain always conducting to model a match, responding to compare bit line transitions in the same way as a real chain with a match, the dummy chain comprising means for detecting when precharge is complete, at its end opposite precharge circuitry.

27. The CAM of claim 1, further comprising a dummy word for determining when sufficient time has elapsed for a match to complete, wherein the word is segmented into the same number of chains as an actual word of storage;

each chain has the same number of cells as an actual storage chain, but composed of dummy core cells, instead of real core cells;

each chain always conducts to model a match, and responding to compare bit line transitions in the same way as a real chain with a match.

28. The CAM of claim 1, further comprising a global data bus, connecting peripheral circuitry to the words of the CAM, wherein the bus joins all words and is used for search, read or write operations, supplying bi-directional data, and all drivers onto the bus are tri-statable.

29. A core cell comprises:

first and second N-channel FETs and first and second P-channel FETs forming two cross-coupled inverters for storing differential data;

third and fourth N-channel FETs coupled with the differential data nodes to differential bit lines, the FETs being gated by a word line, so as to provide access for read and write data operations;

a fifth N-channel FET;

sixth and seventh N-channel FETs, either of them being gated by the positive storage node and for connecting a positive comparison bit line to the gate of the fifth N-channel FET, the other being gated by the negative storage node and for connecting a negative comparison bit line to the gate of the fifth N-channel FET, the comparison bit lines being physically distinct from the bit lines employed for read and write access, the source and drain of the fifth N-channel FET being connected to those of neighbouring cells to form a chain of such FETs.

30. The CAM of claim 1, further comprising a dummy match line chain including model CAM cells associated with comparison bit lines.

31. The CAM of claim 30, wherein the model CAM cell comprises:

a static differential data storage comprising two cross-coupled inverters formed by fourth and fifth FETs of a first channel type and sixth and seventh FETs of a second channel type;

eighth and ninth FETs for coupling the static differential data storage to bit lines, the eighth and ninth FETs being gated by a word line signal to provide access for read and write operations of the static differential data storage;

a tenth FET, the source and drain of which are connected to neighbouring cells to form a chain;

an eleventh FET gated by a positive comparison bit line signal to connect the positive comparison bit line to the gate of the tenth FET; and a twelfth FET gated by a negative comparison bit line signal to connect the negative comparison bit line to the gate of the tenth FET.

32. The CAM of claim 31, wherein the FETs of the first and second channel types are N-channel and P-channel FETs, respectively.

33. The CAM of claim 30, wherein the model CAM cell comprises:

a first inverter formed by a thirteenth FET of a first channel type and a fourteenth FET of a second channel type, the first inverter inverting the logical state of a positive comparison bit line signal;

a second inverter formed by a fifteenth FET of the first channel type and a sixteenth FET of the second channel type, the second inverter inverting the logical state of a negative comparison bit line signal;

a seventeenth FET, the source and drain of which are connected to neighbouring cells to form a chain;

an eighteenth FET gated by an inverted signal by the first inverter to connect the negative comparison bit line to the gate of the seventeenth FET; and a nineteenth FET gated by an inverted signal by the second inverter to connect the positive comparison bit line to the gate of the seventeenth FET.

34. The CAM of claim 33, wherein the FETs of the first and second channel types are N-channel and P-channel FETs, respectively.

35. The CAM of claim 30, wherein the model cell comprises:

twentieth and twenty-first FETs gated by a word line signal to connect negative and positive static storage nodes to a high voltage terminal and a floating source, respectively;

a twenty-second FET of a first channel type, the drain, gate and source of which are connected to the positive static storage node, the negative static storage node and a low voltage terminal, respectively;

a twenty-third FET of the first channel type, the drain, gate and source of which are connected to a floating terminal, the positive static storage node and the low voltage terminal, respectively;

a twenty-fourth FET of a second channel type, the twenty-fourth FET being a diode-connected FET and connected between a high voltage terminal and the negative static storage node;

a twenty-fifth FET of the second channel type, the source, gate and drain of which are connected to the high voltage terminal, the positive static storage node and the negative static storage node, respectively;

a twenty-sixth FET, the source and drain of which are connected to neighbouring cells to form a chain;

a twenty-seventh FET gated by a signal on the positive static storage node to connect a positive comparison bit line to the gate of the twenty-sixth FET; and a twenty-eighth FET gated by a signal on the negative static storage node to pull the gate of the twenty-sixth FET to a high voltage level.

36. The CAM of claim 35, wherein the FETs of the first and second channel types are N-channel and P-channel FETs, respectively.

* * * * *